United States Patent
Watanabe et al.

(10) Patent No.: US 8,911,063 B2
(45) Date of Patent: Dec. 16, 2014

(54) THIN FILM FORMING APPARATUS, THIN FILM FORMING METHOD, ELECTRO-MECHANICAL TRANSDUCER ELEMENT, LIQUID EJECTING HEAD, AND INKJET RECORDING APPARATUS

(71) Applicants: Yasuhiro Watanabe, Kanagawa (JP); Osamu Machida, Kanagawa (JP); Akira Shimofuku, Kanagawa (JP); Ryo Tashiro, Kanagawa (JP); Atsushi Takeuchi, Kanagawa (JP)

(72) Inventors: Yasuhiro Watanabe, Kanagawa (JP); Osamu Machida, Kanagawa (JP); Akira Shimofuku, Kanagawa (JP); Ryo Tashiro, Kanagawa (JP); Atsushi Takeuchi, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 11 days.

(21) Appl. No.: 13/751,206

(22) Filed: Jan. 28, 2013

(65) Prior Publication Data

US 2013/0194350 A1 Aug. 1, 2013

(30) Foreign Application Priority Data

Jan. 31, 2012 (JP) ................. 2012-017938

(51) Int. Cl.
| | |
|---|---|
| *B41J 2/045* | (2006.01) |
| *H05K 13/00* | (2006.01) |
| *H02N 11/00* | (2006.01) |
| *B41J 2/14* | (2006.01) |
| *H01L 21/00* | (2006.01) |
| *B05C 9/10* | (2006.01) |
| *H01L 21/67* | (2006.01) |

(52) U.S. Cl.
CPC .............. *H05K 13/00* (2013.01); *H02N 11/006* (2013.01); *B41J 2/14* (2013.01); *H01L 21/00* (2013.01); *B05C 9/10* (2013.01); *H01L 21/67051* (2013.01); *H01L 21/6715* (2013.01)
USPC .................................. 347/68; 347/71; 347/54

(58) Field of Classification Search
CPC ........ B41J 2/161; B41J 2/045; B41J 2/14233; H01L 41/318; H01L 21/67051; H05K 13/00; H02N 11/006
USPC ...................................................... 347/68–72
See application file for complete search history.

(56) References Cited

U.S. PATENT DOCUMENTS 7,648,734 B2 * 1/2010 Machida et al. .............. 427/209

FOREIGN PATENT DOCUMENTS

| JP | 4065962 | 3/2008 |
|---|---|---|
| JP | 2008-161779 | 7/2008 |
| JP | 2009-256795 | 11/2009 |
| JP | 2011-108996 | 6/2011 |
| WO | 2006/112408 A1 | 10/2006 |

OTHER PUBLICATIONS

A. Kumar and G. M. Whitesides, Appl. Phys. Lett., 63, 2002 (1993).

* cited by examiner

*Primary Examiner* — Juanita D Jackson
(74) *Attorney, Agent, or Firm* — Cooper & Dunham LLP

(57) ABSTRACT

A thin film forming apparatus which automatically forms, on an electrode layer formed on a substrate, a functional thin film which is crystallized from a precursor layer is disclosed, including a water-repellant film forming unit which forms, on a region other than a region on which is to be formed the functional thin film on the electrode layer, a water-repellant film which includes a self-assembled monolayer; an inkjet coating unit which coats, on the region on which is to be formed the functional thin film on the electrode layer, the precursor layer by an inkjet method; and a controller which controls, to within a predetermined time, a time from forming the water-repellant film with the water-repellant film forming unit to coating the precursor layer with the inkjet coating unit.

9 Claims, 12 Drawing Sheets

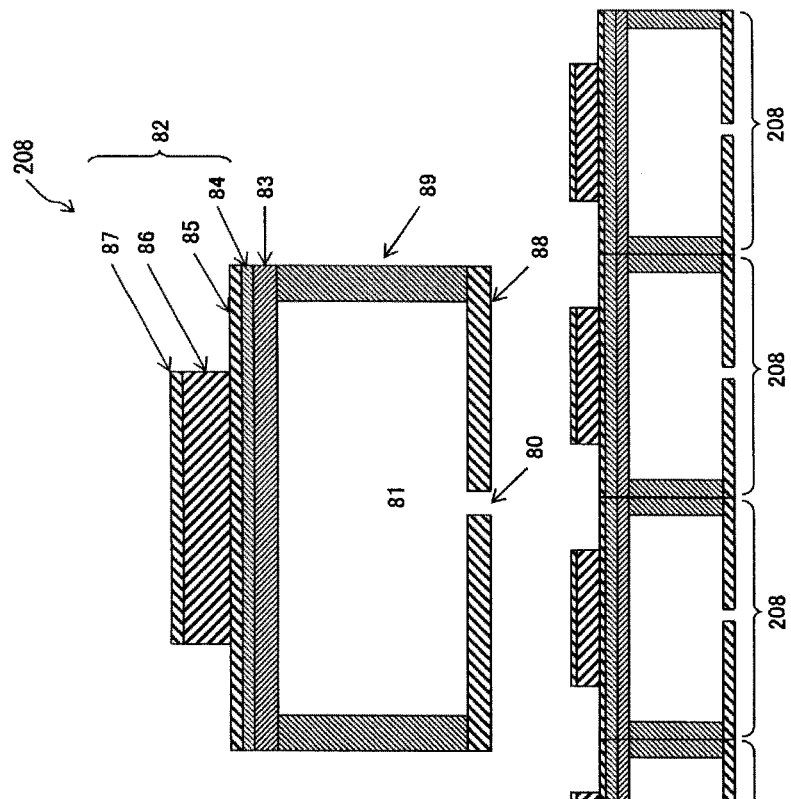

PURE WATER CONTACT ANGLE LESS THAN OR EQUAL TO 5°

PURE WATER CONTACT ANGLE 105°

METHOXYETHANOL CONTACT ANGLE
10°

PURE WATER CONTACT ANGLE
18°

METHOXYETHANOL CONTACT ANGLE 16°

PURE WATER CONTACT ANGLE 35°

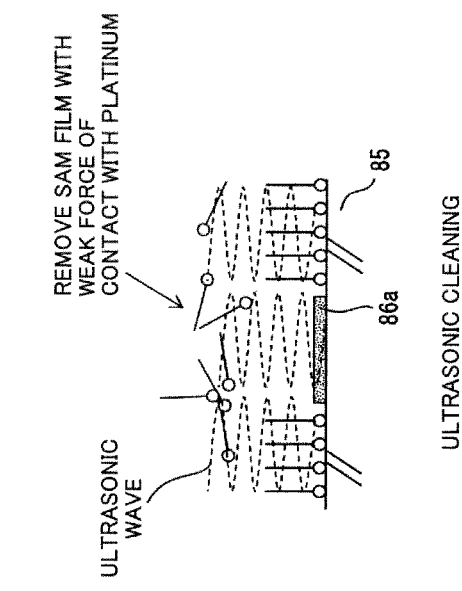
FIG.10A  AFTER SAM TREATMENT
FIG.10B  ULTRASONIC CLEANING

THIN FILM FORMING APPARATUS, THIN FILM FORMING METHOD, ELECTRO-MECHANICAL TRANSDUCER ELEMENT, LIQUID EJECTING HEAD, AND INKJET RECORDING APPARATUS

TECHNICAL FIELD

The present invention relates to thin film forming apparatuses, thin film forming methods, electro-mechanical transducer elements, liquid ejecting heads, and inkjet recording apparatuses.

BACKGROUND ART

In a method of forming a functional thin film on an electrode layer by patterning a precursor of a complex oxide (PZT, for example) on the electrode layer provided on a substrate by an inkjet method, and sintering the precursor, it is necessary to make, in advance, a region on which the functional thin film is to be formed a liquidphilic portion and a region on which the functional thin film is not to be formed a liquid-repellant portion.

As a method of forming a water-repellant portion on the electrode layer film, there is a method of forming a self-assembled monolayer on a region on which the functional thin film is not to be formed (see Non-patent document 1 and Patent document 1, for example). For example, a substrate, as needed, undergoes a pre-cleaning treatment in which impurities on a surface of the electrode layer are removed, then a soaking treatment of a self-assembled monolayer film solution, and then a cleaning treatment of unnecessary self-assembled monolayers which remain on the electrode layer, and finally a drying treatment. With such processes, the self-assembled monolayer film is formed on the electrode layer.

However, from forming the self-assembled monolayer film on the electrode layer to coating the precursor of the complex oxide by the inkjet method, the substrate moves between respective dedicated apparatuses. Therefore, time elapses with the movement. Then, there is a problem that, when the time exceeds a predetermined time, impurities within the atmosphere adhere to the liquidphilic portion, so that a desired functional thin film may not be formed.

RELATED ART DOCUMENTS

Patent Document

Patent Document 1: JP2011-108996A

Non-Patent Document

Non-patent document 1: A. Kumar and G. M. Whitesides, Appl. Phys. Lett., 63, 2002 (1993)

DISCLOSURE OF THE INVENTION

In light of the problems as described above, an object of embodiments of the present invention is to provide a thin film forming apparatus and a thin film forming method that make it possible to form a desired functional thin film; an electro-mechanical transducer element which includes the functional thin film formed by the thin film forming apparatus; a liquid ejecting head which includes the electro-mechanical transducer element; and an inkjet recording apparatus which includes the liquid ejecting head.

According to an embodiment of the present invention, a thin film forming apparatus which automatically forms, on an electrode layer formed on a substrate, a functional thin film which is crystallized from a precursor layer is provided, including a water-repellant film forming unit which forms, on a region other than a region on which is to be formed a functional thin film on the electrode layer, a water-repellant film which includes a self-assembled monolayer; an inkjet coating unit which coats, on the region on which is to be formed the functional thin film on the electrode layer, the precursor layer by an inkjet method; and a controller which controls, to within a predetermined time, a time from forming the water-repellant film with the water-repellant film forming unit and coating the precursor layer with the inkjet coating unit.

Embodiments of the present invention provide a thin film forming apparatus and a thin film forming method that make it possible to form a desired functional thin film; an electro-mechanical transducer element which includes the functional thin film formed by the thin film forming apparatus; a liquid ejecting head which includes the electro-mechanical transducer element; and an inkjet recording apparatus which includes the liquid ejecting head.

BRIEF DESCRIPTION OF THE DRAWINGS

Other objects, features, and advantages of the present invention will become more apparent from the following detailed descriptions when read in conjunction with the accompanying drawings, in which:

FIG. 3A is a schematic sectional view of a single liquid ejecting head;

FIG. 3B is a schematic sectional view of a liquid ejecting head in which multiple units are arranged.

FIG. 5B is a view for explaining the pure water contact angle on a functional thin film 86a;

FIG. 6A is a view for explaining a pure water contact angle on the functional thin film 86a;

FIG. 6B is a view for explaining a methoxyethanol contact angle on a functional thin film 86a;

FIG. 7A is a view for explaining the pure water contact angle on the functional thin film 86a;

FIG. 7B is a view for explaining the methoxyethanol contact angle on the functional thin film 86a;

FIG. 10A is a schematic sectional view explaining a state on an electrode layer after an SAM treatment;

FIG. 10B is a schematic sectional view explaining a state on the electrode layer after ultrasonic cleaning;

BEST MODE FOR CARRYING OUT THE INVENTION

A description is given below, with reference to the drawings, of embodiments of the present invention. The present invention is not to be limited to embodiments described below.

Figure 1:
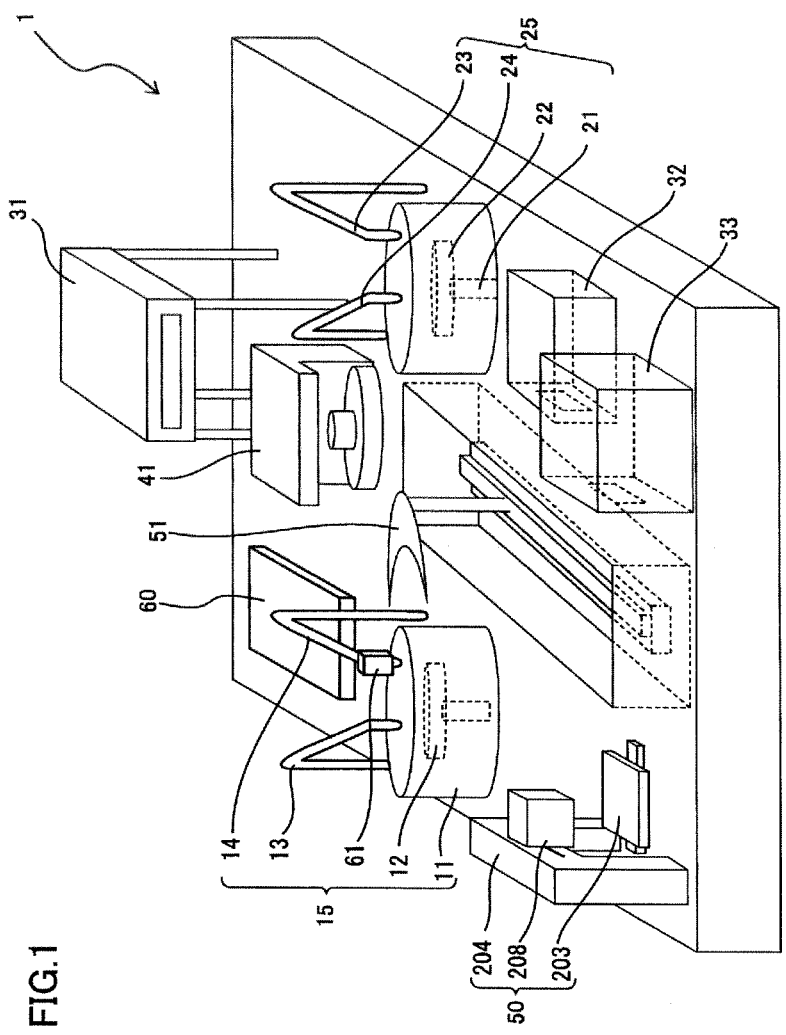
FIG. 1 is a schematic perspective view of a thin film forming apparatus.

FIG. 1 is a schematic perspective view of a thin film forming apparatus.

A thin film forming apparatus 1 according to the present invention is a thin film forming apparatus, into which are integrated a mechanism which forms a self-assembled monolayer film and a mechanism which automatically forms a complex oxide, wherein a functional thin film crystallized from a precursor layer is formed, according to a sol-gel process, on an electrode formed on a substrate.

The thin film forming apparatus 1 includes a water-repellant film forming unit 15 which forms a water-repellant film including a self-assembled monolayer on a region other than a region on the electrode layer on which a functional thin layer is to be formed; an inkjet coating unit 50 which coats the precursor layer by an inkjet method; and a controller 60 which controls, within a predetermined time, a time from forming the water-repellant film by the water-repellant film forming unit 15 to coating the precursor layer by the inkjet coating unit 50 on the region on the electrode layer on which the functional thin film is to be formed. The inkjet coating unit 50 may be called an inkjet coating apparatus 50.

In addition, the thin film forming apparatus 1 includes a pre-cleaning treatment unit 25; hot plates 31 and 32; an RTA (rapid thermal annealing) apparatus 33; an aligner 41; and a robot arm 51. Each member provided by the thin film forming apparatus 1 is under the atmospheric ambience.

The water-repellant film forming unit 15, which forms the self-assembled monolayer film includes a chamber for an SAM treatment 11 with a spinner cup structure; a spinner chuck 12; a nozzle for an SAM solution 13; and a nozzle for ethanol 14. At a tip of the nozzle for ethanol 14 is installed an ultrasound generating apparatus 61 which generates an ultrasound. The water-repellant film forming unit 15 can execute a supplying treatment which provides a solution including a self-assembled monolayer to the substrate and a cleaning treatment which removes the self-assembled monolayer which remains on the electrode layer. In the cleaning treatment, an organic solvent and the ultrasound are used (described below).

The pre-treatment cleaning unit 25 includes a chamber for pre-cleaning treatment 21 with a spinner cup structure; a spinner chuck 22; a nozzle for weak acid solution 23; and a nozzle for pure water 24.

The hot plate 31 is used in a drying process after the substrate is pre-cleaning treated. Fixing of the spinner chucks 12 and 22 to the substrate may be performed by either a vacuum scheme or a pinning scheme. In the embodiments, the vacuum scheme is adopted.

In order to form a composite oxide film such as a PZT film, etc., the thin film forming apparatus 1 includes the inkjet coating unit 50 of the inkjet scheme; the hot plate 32 for solvent drying; and the RTA (rapid thermal annealing) apparatus 33 for sintering. Details of the inkjet coating unit 50 will be described using a different drawing.

A basic flow of a subject (a substrate, for example) within the thin film forming apparatus 1 is as follows. First, when the substrate is loaded into the thin film forming apparatus 1, the substrate is installed in the aligner 41. Next, the substrate is pre-cleaning treated at the chamber for pre-cleaning treatment 21. Then, the substrate is drying treated at the hot plate 31. Next, the substrate is SAM treated in the chamber for SAM treatment 11. Then, a precursor of the complex oxide film is coated onto the substrate by an inkjet method.

Next, the substrate is moved to the hot plate 32, where the solvent within the precursor is dried. Then, it is moved to the RTA apparatus 33, where the precursor is sintered. After the sintering, the substrate is moved back to the aligner 41. After being installed in the aligner 41, the substrate undergoes one cycle from the pre-cleaning treatment; installation into the hot plate 31; an SAM treatment: inkjet coating; solvent drying; and sintering. Movements of the substrate within the thin film forming apparatus 1 are performed by the robot arm 51.

In this way, by carrying the substrate into the thin film forming apparatus 1, a step of forming the water-repellant film including the self-assembled monolayer on the region on the electrode layer other than the region on which the functional thin film is to be formed and a step of forming the precursor layer by the inkjet method on the region on the electrode layer on which the functional thin film is to be formed. Moreover, a time from forming the water-repellant film to forming the precursor layer is controlled to fall within a predetermined time.

Furthermore, within the thin film forming apparatus 1, a system is introduced which may control a time from completing the SAM treatment to starting the inkjet coating. This system is stored as programming within the thin film forming apparatus 1.

Figure 2:
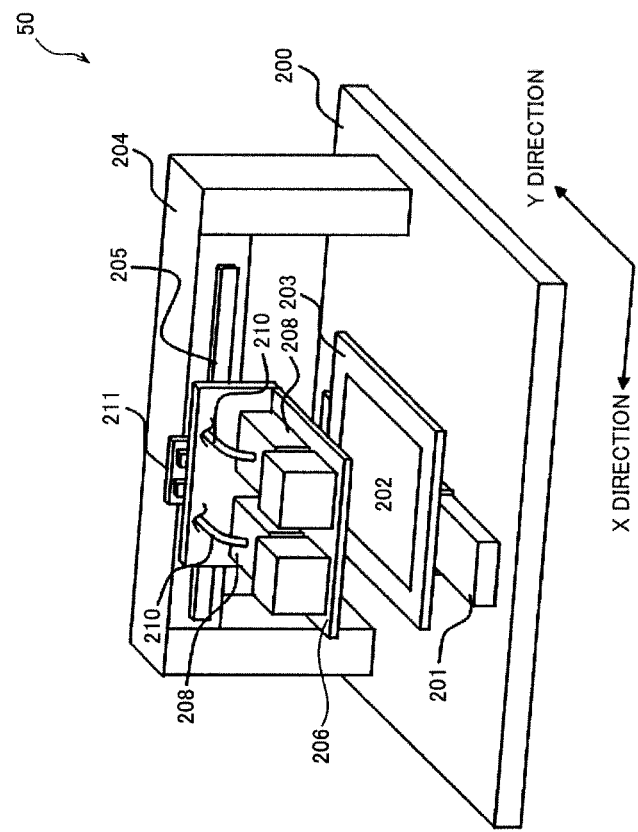
FIG. 2 is a perspective view for explaining an inkjet coating unit.

FIG. 2 is a perspective view for explaining an inkjet coating unit.

FIG. 2 shows a substrate 202 in addition to an inkjet coating unit 50. The inkjet coating unit 50 has a Y-axis drive unit 201 installed on a platform 200, above which Y-axis drive unit 201a stage 203 which has installed thereon the substrate 202 is installed such that the stage 203 may drive in a Y-axis direction. The stage 203 has provided thereon accompanying elements of an adsorbing unit which adsorbs static electricity, a vacuum (not shown), etc., and has the substrate 202 fixed thereto.

Moreover, on an X-axis supporting member 204 is installed an X-axis drive unit 205, on which X-axis drive unit 205 is mounted a head base 206 via a Z-axis drive unit 211, the head base 206 being arranged to move in X-axis and Z-axis directions. On the head base 206 are installed liquid ejecting heads 208 which eject ink. The liquid ejecting head 208 is supplied ink via a pipe for supplying colored resin ink 210 from a corresponding ink tank (not shown).

FIG. 3A is a schematic sectional view of a single liquid ejecting head 208 and FIG. 3B is a schematic sectional view in which multiple liquid ejecting heads 208 are arranged.

In the present invention, a single liquid ejecting head 208 may be used, or plural of the liquid ejecting heads 208 may be used. The liquid ejecting head 208 is embedded into the inkjet coating unit 50.

The liquid ejecting head 208 includes a nozzle 80 which ejects ink droplets; a pressure chamber 81 (also called a liquid chamber, an ejecting chamber, a pressurizing liquid chamber, an ink flow path, etc.) to which the nozzle 80 is communicatively connected; an electro-mechanical transducer element 82 as a pressure generating unit which pressurizes ink to be supplied into the pressure chamber 81; and a vibrating plate 83 which is in contact with the pressure chamber 81.

The electro-mechanical transducer element 82 includes a laminated structure in which are laminated, from the bottom side in the order of a contact layer 84; an electrode layer 85 (a lower electrode film); a functional thin film (electro-mechanical transducer film) 86; and an electrode layer 87 (an upper electrode film). The functional thin film 86 is formed by a thin film forming apparatus having the same features as the thin film forming apparatus 1.

In the liquid ejecting head 208, a voltage is applied to the electrodes 85 and 87 to cause the electro-mechanical transducer element 82 to generate energy. In this way, ink spouts out of the nozzle 80. The number 88 denotes a nozzle plate, while the number 89 denotes a pressurizing chamber substrate (silicon substrate). The present invention makes it possible to form an electro-mechanical transducer element 82 in a simple and convenient manufacturing process.

When the liquid ejecting head 208 is to be formed, back face etching is applied for forming the pressurizing chamber 81 in the above-described substrate 89 and a concave portion, or in other words the pressurizing chamber 81 is formed on the substrate 89 back face. Then, the nozzle plate 88 which has the nozzle 80, and the pressurizing chamber substrate 89 (or, in other words, substrate after the etching) are bonded to form the liquid ejecting head 208. In the Figures, a liquid supplying unit, a flow path, a fluid resistance, etc., are omitted.

The above-described pressure generating unit may be a piezoelectric-type unit, wherein an electro-mechanical transducing element such as a piezoelectric element, etc., is used to deform and displace a vibrating plate forming a wall face of the ejecting chamber to cause ink droplets to be ejected, or a bubble-type (a thermal-type) unit, wherein an electro-thermal transducer element such as a heat generating resistive body which is installed within the ejecting chamber, is used to generate bubbles by film boiling of ink to eject ink droplets.

The piezoelectric-type unit may be a vertical vibration-type unit which uses deforming in a d33 direction; a horizontal vibration-type unit (a bend mode-type unit) which uses deforming in a d31 direction; a shear mode-type unit which uses shear deforming, etc. The liquid ejecting head 208 may be a thin film actuator, wherein a liquid chamber and a piezoelectric element are directly built into a silicon substrate thereof.

When the functional thin film 86 is PZT, the functional thin film 86 is formed by a sol-gel method. As a starting material for forming the electro-mechanical transducer film are used lead acetate, a zirconium alkoxide compound, and a titanium alkoxide compound, which are dissolved in methoxyethanol as a common solvent to obtain a homogeneous solution. This homogeneous solution is called a PZT precursor solution.

PZT, which is a solid solution of lead zirconate ($PbZrO_3$) and titanic acid ($PbTiO_3$), differs in the characteristics according to the ratio thereof. A composition which demonstrates a generally superior piezoelectric characteristic is a ratio between $PbZrO_3$ and $PbTiO_3$ of 53:47, which shown in a chemical formula is Pb (Zr 0.53, Ti 0.47) $O_3$, generally denoted as PZT (53/47). The starting material of lead acetate, the zirconium alkoxide compound, and the titanium alkoxide compound, is weighted according to this chemical formula.

Moreover, the metal alkoxide compounds are easily hydrolyzed by moisture in the atmosphere, so that an appropriate amount of stabilizer such as acetyl acetone, acetic acid, diethanolamine, etc., may be added as a stabilizer to the PZT precursor solution.

Besides PZT, the functional thin film 86 includes a barium titanate film, etc. In this case, a barium alkoxide compound and a titanium alkoxide compound as a starting material are dissolved in methoxyethanol as a common solvent to obtain a homogeneous solution. This homogeneous solution is called a barium titanate precursor solution.

Such a complex oxide represented in a common formula is stated as $ABO_3$. Here, A=Pb, Ba, Sr, while B=Ti, Zr, Sn, Ni, Zn, Mg, Nb. As a more specific notation, it may be expressed as $(Pb_{1-x}, Ba)$ (Zr, Ti)$O_3$, $(Pb_{1-x}, Sr)$ (Zr, Ti)$O_3$. This is a notation when a part of Pb in "A" is replaced by Ba or Sr. Such a replacement is possible for a bivalent element, the effect of which is that an action of reducing characteristic deterioration due to evaporation of lead during a thermal treatment is demonstrated.

When the PZT film is to be formed on the substrate, a PZT precursor layer is formed by a solution coating method such as an inkjet method, a spin coating method, etc., solvent within the PZT precursor layer is dried, and pre-sintering (thermal decomposing) and a thermal treatment for crystallizing are applied to the PZT precursor layer. The pre-sintering serves as "thermal decomposing of organic matter" with the PZT precursor layer which exists even after drying the solvent. Moreover, transforming of the PZT precursor layer to the PZT crystallized film may involve volume compression. In the present invention, in order to obtain a crack-free PZT film, a film thickness of the PZT film in one cycle is controlled to less than or equal to 100 nm. The control of the film thickness is performed by adjusting concentration and amount of the PZT precursor solution.

When the PZT film is used as the functional thin film 86 of the electro-mechanical transducer element, a film thickness of the PZT film needs to fall between 1 μm and 5 μm. In order to obtain such a film thickness, the above-described cycle is repeated several tens times.

For patterning of the functional thin film 86, the PZT precursor solution is differently coated, controlling the wettability of the groundwork. As a method of controlling the wettability of the groundwork, there is a method of using a self-assembled monolayer film (an SAM film). Representative materials include a thiol compound and a silane coupling agent. Each of these, which has respective characteristics, needs to be used differently depending on the usage.

The thiol compound includes alkanethiol ($CH_3(CH_2)_R$—SH). A thiol group within the alkanethiol is chemically adsorbed onto a rare metal such as platinum, etc. In Examples, platinum, etc., are used as a material for the electrode layer 85. A film formed by chemically adsorbing multiple alkanethiols onto the rare metal is the SAM film. A film thickness of the SAM film is in the order of sub-microns. The SAM film differs in adsorbability and hydrophobicity (water-repellant property) relative to the electrode layer 85 depending on a molecular chain length of alkanethiol. Alkanethiol, which is chemically adsorbed onto the rare metal, is relatively stable and is UV resistant.

Alkanethiol having an R (carbon number) of any of 6 to 18 is selected, so that the selected alkanethiol is dissolved in an organic solvent (alcohol, acetone, toluene, etc.) The concentration is less than or equal to a few mols/L (liter). Next, after the substrate is installed within the chamber for SAM treatment 11, an alkanethiol solution is supplied from the nozzle for SAM solution 13 to the substrate to perform an SAM treatment. Then, the substrate is taken out after a predetermined time period. Subsequently, excessive SAM molecules undergo replacement cleaning by a solvent such as alcohol, etc., and then drying, so that the SAM film is formed on a surface of the electrode layer 85. A surface of the SAM film has an alkyl group arranged, so that it becomes hydrophobic.

In this way, a characteristic that a thiol group within a thiol compound is only adsorbed onto the rare metal is used to pattern liquid-repellant and liquidphilic regions. Moreover, as a material to be used as the electrode layer 85, a material which is thermally resistant and from which the SAM film of the thiol compound may be formed is selected. For example, bronze and silver bonds with thiol, but these metals change in quality due to a thermal treatment at greater than or equal to 500° C. in the atmosphere. Moreover, while gold meets both conditions, it may work to the detriment of crystallizing of the PZT film to be laminated. On the other hand, a single metal such as platinum, rhodium, ruthenium, iridium, etc., or an alloy material, such as platinum-rhodium, which includes platinum as a main ingredient, bonds with thiol, also is thermally resistant, and does not work to the detriment of crystallizing of the PZT film. Therefore, a material to be used as the electrode layer 85 is preferably selected from the single metals such as platinum, rhodium, ruthenium, iridium, etc., or the alloy materials, such as platinum-rhodium, which includes platinum as the main ingredient.

Moreover, the silane coupling agent includes a reactive functional group (Y) and a hydrolyzable group (OR). The silane coupling agent can adhere to both organic and inorganic matter. When the hydrolyzable group has a reactive group such as an alxysilane group, a chlorosilane group, etc., the hydrolyzable group of the silane coupling agent reacts with and is adhered to a hydroxy group of an inorganic matter surface. When the hydrolyzable group adheres to the inorganic matter and the reactive functional group contains an alkyl group or fluorine, a water-repellant property is exhibited.

For example, the silane coupling agent with a combination of trichlorosilane, trimethoxysilane, and triethoxysilane as the hydrolyzable group and a combination of octyl, octadecyl, and a fluoro series is adhered to the inorganic matter surface, which surface exhibits a liquid-repellant property.

In particular, a uv-sensitive silane coupling agent such as phenyltrichlorosilane, octadecyltrimethoxysilane, etc., exhibits a water-repellant property when it is formed onto a substrate surface. UV radiation decomposes a replacement group a C—C bond and a C—H bond, forming a silanol group on the substrate surface, which is hydrophiled.

The vibrating plate 83, with a thickness of several μm, may be a silicon oxide film, a silicon nitride film, a silicon oxynitride film, or a laminated film which has the respective films laminated. Moreover, it may be a ceramic film such as a zirconia film, an aluminum oxide film, etc., taking into account a thermal expansion difference relative to the substrate. These materials are insulators.

The electrode layer 85 provides an electrical connection as a common electrode when a signal is input to the electro-mechanical transducer element 82, so that the vibrating plate 83, which is located thereunder, is an insulator, or an insulating process is applied thereto if it is a conductor.

The insulator 83 is silicon oxide formed with a thermal oxide film by CVD, etc., and, as the insulating process, a metal oxide film is formed by sputtering on a surface of the conductor.

When the electrode layer 85 of a platinum group is arranged on the vibrating plate 83, the contact layer 84 is arranged to strengthen a film contact force. A material which can be used for the contact layer 84 includes titanium, tantalum, titanium oxide, tantalum oxide, titanium nitride, tantalum nitride, or a laminated film thereof. In particular, when the electrode layer 85 is a conductive oxide, the vibrating plate 83 is the same oxide (a silicon oxide), making it possible to obtain a sufficient film contact force without arranging the contact layer 83.

EXAMPLES

Below, more specific Examples of the present invention will be described with reference to the drawings.

Example 1

A thermal oxide film (with a film thickness of 1 μm) was grown on a silicon wafer as a substrate and, as the contact layer 83, a titanium film (with a film thickness of 50 μm) was formed onto the thermal oxide film by sputtering. Next, platinum film (with a film thickness of 200 nm) was formed as the electrode layer 85 onto the contact layer 83 by sputtering. Then, as in FIGS. 4A to 4F, which is to be described next, a functional thin film is patterned on the electrode layer 85.

FIGS. 4A to 4F are schematic sectional views for explaining a manufacturing process of an electro-mechanical transducer film.

Figure 4A:
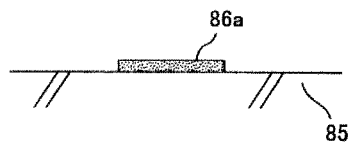
FIGS. 4A to 4F are schematic sectional views for explaining a manufacturing process of an electro-mechanical transducer film.

First, as shown in FIG. 4A, a PZT film, which is a functional thin film 86a, is patterned on the electrode layer 85, which is formed on the substrate (not shown) in advance. The film thickness of the functional thin film 86a is 100 nm. The functional thin film 86a was patterned by photolithographic etching. For example, using a resist pattern (TSMR8800, manufactured by Tokyo Ohka Kogyo, Co., Ltd.), which is a mask pattern, an unnecessary functional thin film is removed by an argon plasma process to pattern the functional thin film 86a. The functional thin film 86a, which is formed first, may also function as a mask material of an SAM film to be described next. Moreover, a composition of the functional thin film 86a is preferably a PZT (53/47) film. The functional thin film 86a may be patterned by the sol-gel method.

The electrode layer 85 is exposed on a region on which the functional thin film 86a is not formed. In order to apply an SAM treatment to the electrode layer 85 which is exposed, a thiol compound was used.

The thiol compound is selected with a chain length (a number of carbons) as a criterion. While the larger the chain length is, a more improved is the liquid-repellant property, the thiol compound includes a thiol group regardless of how long it is. Thus, no problem occurs with forming the SAM film no matter which thiol compound is used. Therefore, the chain length of the thiol compound may be selected freely. In general, a less defective SAM film is formed with a thiol compound with the number of carbons of greater than or equal to 6 (R≥5). In the Example, dodecanthiol (R=11) was used and an SAM solution with a concentration of 0.01 mol/L was used. As a solvent of the SAM solution, ethanol was used.

When the substrate having the patterned functional thin film 86a is carried into the thin film forming apparatus 1, the substrate is preheated with the hot plate 32 in order to remove impurities (organic matter contained in the atmosphere) which adhere onto the functional thin film 86a. Immediately thereafter, the substrate is fixed to the spinner chuck 12. Immediately means within 3 minutes, for example. Then, the SAM solution is jetted from the nozzle for the SAM solution 13 toward the substrate. Moreover, during the time the SAM solution is being jetted, the nozzle for the SAM solution 13 is paddled. For 5 minutes in the paddled state, the SAM solution was provided to the substrate within the spinner chuck 12, after which the substrate underwent a cleaning treatment with ethanol.

In the ethanol cleaning, the substrate was rotated and the SAM solution was shaken off, after which ethanol for a cleaning solution was jetted from the nozzle for ethanol 14. The rotational speed during cleaning is 500 rpm. In the ethanol jetting, the ultrasound generating apparatus 61 which was attached to the tip of the nozzle for ethanol 14 was operated, jetting ethanol with ultrasound toward the substrate. An ethanol flow rate was set to 600 cc/min.

The ultrasound generating apparatus 61, which uses megasonics, can output ultrasound in the megahertz band.

This ultrasound accelerates ethanol, reinforcing the cleaning effect with the energy thereof. Details of ultrasonic cleaning are described below.

Figure 4B:
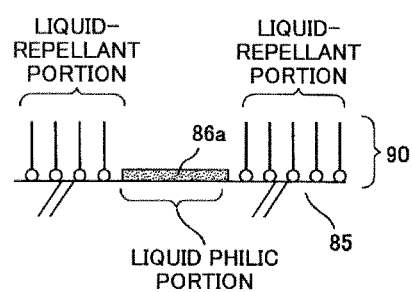

After the cleaning is executed for 2 minutes, jetting of ethanol from the nozzle for ethanol 14 was stopped, immediately after which the rotational speed was raised to 1500 rpm to shake off ethanol adhered to the substrate. The state after which it was shaken off is shown in FIG. 4B.

At this stage, an SAM film (water-repellant film) 90 in which the thiol compound 91 is arranged in a column is formed on the electrode layer 85. On the electrode layer 85, a water-repellant portion in which an SAM film 90 is formed and a liquidphilic portion in which the SAM film 90 is not formed are formed. In the liquidphilic portion, the above-described functional thin film 86a is arranged.

Next, the substrate was carried onto the stage 203 of the inkjet coating unit 50 with the robot arm 51. Then, a PZT precursor solution was provided onto the substrate. The above described pressure chamber 81 is filled up therein with the PZT precursor solution.

For producing the PZT precursor solution, lead acetate trihydrate, titanium isopropoxide, and zirconium isopropoxide were used as starting materials. Water of crystallization in lead acetate was dissolved in methoxyethanol, after which it was dehydrated. For the water of crystallization in lead acetate, a surplus amount of lead relative to the stoichiometric composition of PZT is arranged to be 10 mole %. This is to prevent a so-called lead volatilization from PZT in the thermal treatment. This is because the crystallizability of PZT decreases when the lead volatilization occurs.

Moreover, titanium isopropoxide and zirconium isopropoxide were dissolved in methoxyethanol, subjected to an alcohol exchange reaction and an esterification reaction, and mixed with a methoxyethanol solution in which is dissolved the above-described lead acetate to synthesize a PZT precursor solution. The PZT concentration in this solution was adjusted to 0.1 mole/L. The PZT concentration within the solution is optimized based on a relationship between an area of a film formed and an applied amount of the precursor. Therefore, "0.1 mole/liter" is merely one example, so that it is not limited to the value thereof.

Figure 4E:
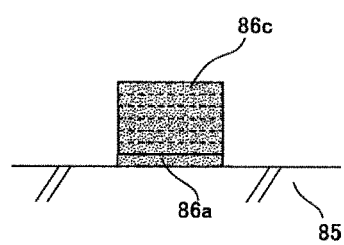
Figure 4C:
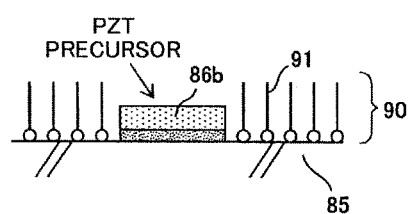

FIG. 4C shows a state after the PZT precursor solution is provided onto the substrate. As shown, the PZT precursor solution is wetted onto the functional film 86a, so that a precursor layer 86b, which is a precursor of the functional film, is formed. Components of the precursor layer 86b immediately after coating are the same as components of the PZT precursor solution. On the SAM film 90, the PZT precursor solution is not wetted, so that the precursor layer 86b is not formed. In the Example, a time (below called "an elapsed time") from forming a water-repellant film by the water-repellant film forming unit 15 to coating the precursor layer by the inkjet coating unit 50 is controlled to be within 3 minutes. Management of this time is controlled by the controller 60.

Next, the substrate was moved to the hot plate 32, and a process of heating the substrate at 120° C. was conducted (first heating) in order to remove (dry) the solvent within the precursor layer 86b. Thereafter, the substrate was moved to the RTA apparatus 33, and a process of heating the precursor layer 86b at 500° C. was conducted (second heating) for a so-called pre-sintering. After the pre-sintering, the film thickness of the precursor layer 86c was 90 nm. This state is shown in FIG. 4D.

Moreover, a pure water contact angle on the electrode layer 85 immediately after the pre-sintering was less than or equal to 5°. This means that the pre-sintering caused the SAM film 90 to disappear from the electrode layer 85. This pre-sintering causes oxygen to adhere onto the electrode layer 85, which oxygen may cause a possibility of the electrode layer surface being contaminated. How to deal with the possibility is described below.

A film thickness of the precursor film 86c obtained in one time sol-gel film forming is preferably less than or equal to 100 nm. This is because a crack may occur in the precursor layer 86 itself, or a functional thin film, wherein the precursor layers 86c are laminated to sinter the laminated layers, when the film thickness of the precursor layer 86c exceeds 100 nm.

Figure 4F:
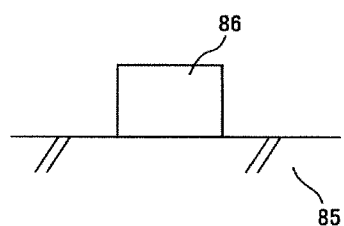
Figure 4D:
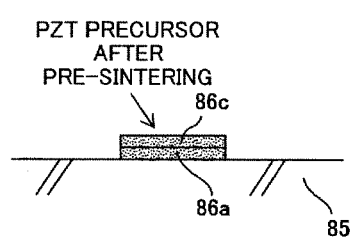

Then, the process in FIGS. 4B to 4D were repeated six times. For each repetition of the SAM treatment, the substrate is moved to the spinner chuck 12. Then, the same treatment as the first time is applied to the substrate. This state is shown in FIG. 4E. As illustrated, the laminated precursor layer 86c (with a layer thickness of 540 nm) is formed on the functional thin film 86a.

Moreover, in order to crystallize the laminated precursor layer 86c, a heating process (at a temperature of 700° C.) was conducted. The heating process is an RTA (rapid thermal annealing). The state after conducting the RTA process is shown in FIG. 4F. As illustrated, the functional thin film 86 is formed on the electrode layer 85. The film thickness of the functional thin film 86 is 640 nm. No defects such as cracks occurred in particular in the functional thin film 86. A composition of the functional thin film 86 is a PZT (53/47) film.

In repeating the process in FIGS. 4B to 4D, the elapsed time in the respective repetitions is less than or equal to 3 minutes in each time of repetition, and, moreover, it is controlled to be the same time each time of the repetition. In other words, according to the present invention, in the process each time, a time from forming a liquidphilic portion and a water-repellant portion on the electrode layer 85 to coating the PZT precursor solution is set to be short and constant so as to obtain stable surface energy of the liquidphilic portion and a highly reliable functional thin film.

Moreover, in the process each time, the SAM film 90 is automatically formed, so that the surface energy of the SAM film 90 is always stabilized. Varying the elapsed time causes a sectional shape, contactability, a composition, etc., of the precursor layer 86c, wherein films were formed repeatedly, to vary, causing the reliability of the functional thin film 86 finally formed to decrease.

Figure 5B:
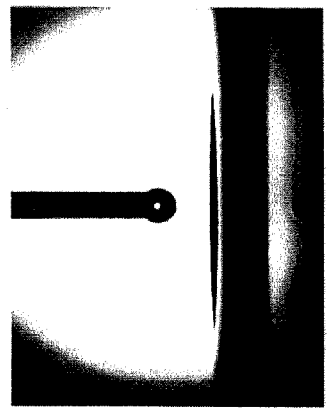
Figure 5A:
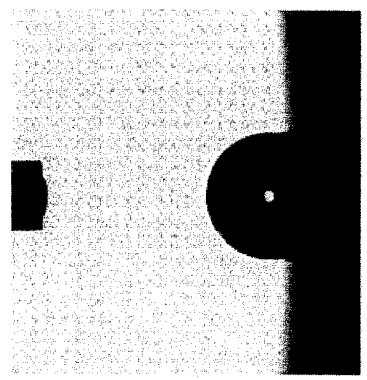
FIG. 5A is a view for explaining a pure water contact angle on an SAM film 90.

FIG. 5A is a view for explaining a pure water contact angle on the SAM film 90, and FIG. 5B is a view for explaining the pure water contact angle on the functional thin film 86a.

In the stage in FIG. 4B, an evaluation of a liquid-repellant property was conducted using a contact angle meter in order to confirm that the SAM film 90 is formed only on the electrode layer 85. As a result, the pure water contact angle on the SAM film 90 was 105° (see FIG. 5A), while the pure water contact angle on the SAM film 86a was less than or equal to 5° (complete wetting). In other words, it was confirmed that the SAM film 90 was not formed on the complex oxide and formed only on the electrode layer 85. The pure water contact angle when pure water was coated directly onto the electrode layer 85 was less than or equal to 5°.

When methoxyethanol was used in lieu of the pure water, the methoxyethanol contact angle on the SAM film 90 was 73°, while methoxyethanol contact angle on the functional thin film 86a was less than or equal to 5° (complete wetting).

Moreover, the contact angle on the SAM film 90 after the second SAM treatment was 104°, so that the liquid-repellant property equivalent to the first time was obtained (the methoxyethanol contact angle was 71°). On the other hand, the pure water contact angle on the precursor layer 86c was 5° (the methoxyethanol contact angle was 5°).

Figure 6B:
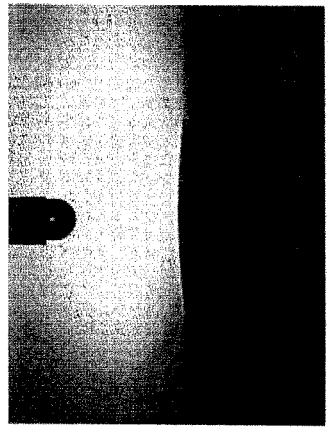
Figure 6A:
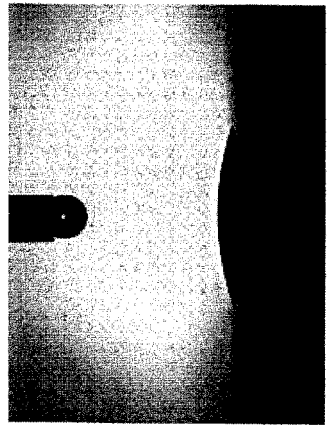

FIG. 6A is a view for explaining a pure water contact angle on the functional thin film 86a, and FIG. 68 is a view for explaining the methoxyethanol contact angle on the functional thin film 86a.

In the embodiment, the elapsed time is set to within three minutes. In FIGS. 6A and 6B is shown a contact angle in the functional thin film 86a when the elapsed time exceeds 3 minutes.

The functional thin film 86a is inherently a liquidphilic portion, so that the contact angle therein is preferably less than or equal to 5° (Complete wetting). However, when the elapsed time exceeds 3 minutes, the pure water contact angle was 18° (see FIG. 6A), while the methoxyethanol contact angle was 10° (see FIG. 6B). This means that, when the elapsed time exceeded 3 minutes, impurities (for example, inorganic matter) included in the atmosphere adhered to the functional thin film 86a, so that a surface energy of the functional thin film 86a changed. The PZT precursor solution has a predetermined viscosity, and, when the elapsed time exceeds 3 minutes, the PZT precursor solution does not undergo wet spreading onto the functional thin film 86a sufficiently. When the PZT precursor solution does not undergo wet spreading onto the functional thin film 86a sufficiently, as described above, reliability of the functional thin film 86 which is finally formed decreases. According to the present invention, the elapsed time is set within 3 minutes, so that the PZT precursor solution undergoes wet spreading onto the functional thin film 86a sufficiently.

Figure 7B:
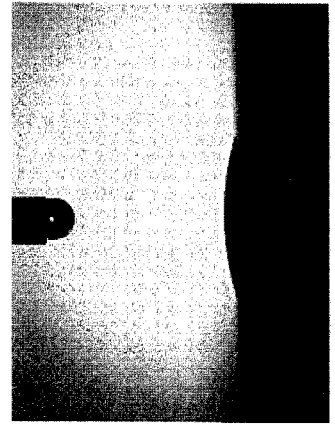
Figure 7A:
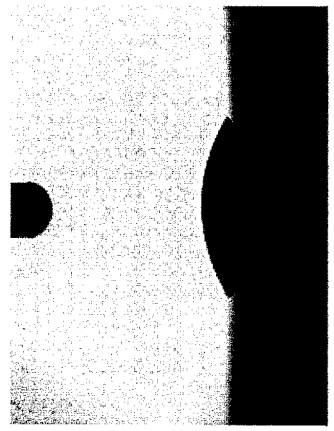

FIG. 7A is a view for explaining a pure water contact angle on the functional thin film 86a, and FIG. 7B is a view for explaining the methoxyethanol contact angle on the functional thin film 86a.

The thin film forming apparatus 1 according to the present invention is an apparatus which has integrated therein a forming unit of the SAM film and a forming unit of the functional thin film. Now, using two independent apparatuses for the respective forming units of the SAM film and the functional thin film involves manpower time intervening from forming the SAM film to selectively coating the functional thin film. For example, greater than or equal to approximately 10 minutes are needed for substrate setting, alignment adjustment, and a liquid ejecting head, etc.

In FIGS. 7A and 75 are shown a contact angle in the functional thin film 86a when the elapsed time exceeds 10 minutes. As a result, the pure water contact angle was 35° (see FIG. 7A), and the methoxyethanol contact angle was 16°, so that the contact angle further increased.

Figure 8:
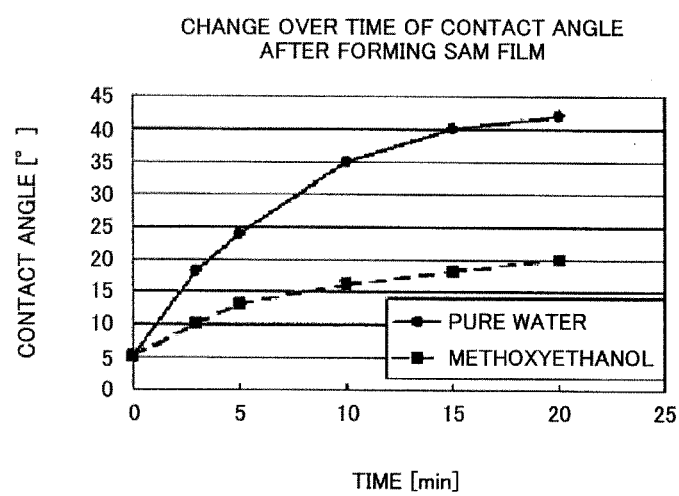
FIG. 8 is a view explaining a relationship between an elapsed time and a contact angle.

FIG. 8 is a view explaining a relationship between an elapsed time and a contact angle.

For moving the substrate between apparatuses by manpower, a moving time differs depending on an operator. Assuming the above, FIG. B shows a relationship between a contact angle and a time when the elapsed time is set to 5, 10, 15, and 20 minutes. It is seen from the above-mentioned figure that the contact angle increases the longer the elapsed time becomes.

In particular, it is seen that, when the elapsed time reaches 20 minutes, the liquidphilicity of the functional thin film surface significantly decreases, so that the PET precursor solution does not undergo wet spreading onto the functional thin film 86a sufficiently.

Therefore, in the Example, the elapsed time is controlled to within 3 minutes. Moreover, an ambience within the thin film forming apparatus 1 is atmosphere, a temperature within the apparatus is 22-25° C., and the humidity therein is set to 40-50%. Now, it is also possible to make the ambience within the apparatus an inert gas such as argon, nitrogen, etc. However, this is not preferable as it brings about high cost due to the use of gas and an increase in a size of the facilities. Moreover, a vacuum mechanism also brings about making the apparatus complicated and cumbersome, leading to high cost.

Example 2

A pre-cleaning treatment may be conducted on the electrode layer 85 whose surface is contaminated by oxygen. The pre-cleaning treatment may be an acid treatment using acetic acid, hydrochloric acid, etc., for example. Acid causes a reducing effect on a PZT film on the electrode layer 85. Therefore, a weak acid with a pH of 2 to 5 is used in the acid treatment. For example, acetic acid with a pH of 2.5 is diluted 10 fold with pure water to prepare an acetic acid solution with a pH of 3.3. A glass electrode type pH meter was used for measuring the pH.

In order to conduct the pre-cleaning treatment, the substrate was fixed to the spinner chuck 22 within the chamber for pre-cleaning treatment 21. Onto the fixed substrate, the acetic acid solution is provided from the nozzle for weak acid solution 23. The acetic acid solution is provided onto the substrate for 1 minute while the nozzle for weak acid solution 23 is paddled, the substrate is rotated (500 rpm) and pure water is jetted from the nozzle for pure water 24 toward the substrate. The time for cleaning with pure water is 2 minutes.

After the pure water cleaning is completed, the rotational speed is increased to 1500 rpm and the pure water is shaken off from the substrate. Next, the substrate is taken out from the spinner chuck 22 by the robot arm 51 and is re-dried with the hot plate 31 (for 1 minute at 120° C.). Such an acid treatment makes it possible to clean the electrode whose surface is contaminated by oxygen. Onto a surface of the electrode 85 whose surface is cleaned, a thiol compound 91 is efficiently adhered again. The pre-cleaning treatment of the substrate may be performed when a surface of platinum was contaminated with impurities, so that it is not necessary to conduct the pre-cleaning treatment when the substrate is loaded into the chamber for pre-cleaning treatment 21 for the first time, for example.

Example 3

The process of repeating in FIGS. 4B to 4D is not limited to six times, so that a further repeating may be embodied.

For example, as described above, after the functional thin film 86 with the film thickness of 640 nm was obtained, the process in FIGS. 4B to 4D was repeated again. Then, a heating treatment (at a temperature of 700° C.) was conducted for crystallization. The thermal treatment for crystallization is the RTA treatment. This caused the thickness of the functional thin film to reach 1000 nm. No defects such as cracks occurred in this functional thin film 86.

An upper electrode (a platinum film) was further formed onto this functional thin film 86 to evaluate an electro-mechanical transducer performance (piezoelectric constant) and an electrical characteristic of the functional thin film 86.

Figure 9A:
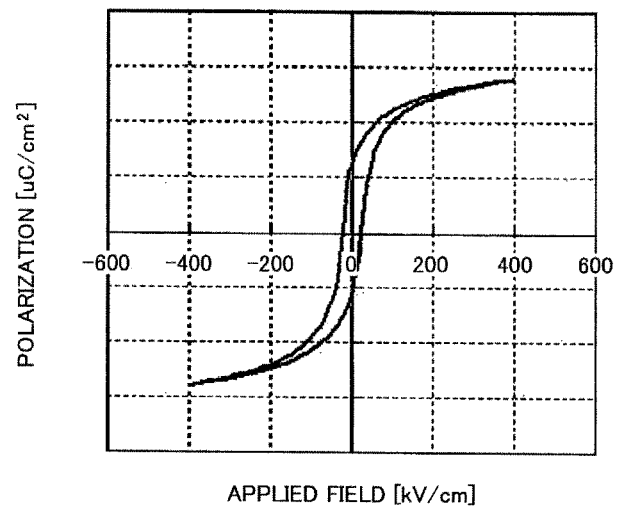
FIGS. 9A and 9B are views illustrating an example of a P-E hysteresis curve.
Figure 9B:
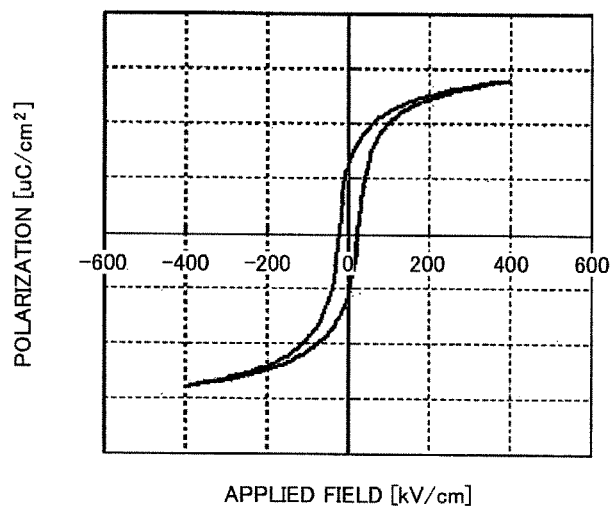

FIGS. 9A and 9B are views illustrating an example of a P-E hysteresis curve.

When the functional film 86 is a PZT film, a relationship between polarization and an applied field to the film is a P-E curve having a hysteresis as shown in FIG. 9A. It is seen from FIG. 9A that a residual polarization (a crossing point between the curve and a vertical axis) is 19.3 $\mu C/cm^2$ and a coersive electric field (a crossing point between the curve and the horizontal axis) is 36.5 kV/cm. Moreover, the relative permittivity of the PZT film was 1220 and the dielectric loss was 0.02. It is seen that the PZT film formed has an equivalent characteristic as that of an ordinary ceramic sintered compact.

Moreover, the electro-mechanical transducer performance of the PZT film was calculated by measuring a deformation amount due to electric field application with a laser Doppler vibrometer and calibrating by simulation. As a result, the piezoelectric constant d31 was −120 pm/V, which value indicates having the equivalent characteristic as that of the ceramic sintered compact. In other words, the PZT film formed has a characteristic value such that it may function adequately in a liquid ejecting head.

Moreover, when the elapsed time exceeded 10 minutes, the functional thin film 86 with a film thickness of 1000 nm was formed to conduct a similar evaluation. The result is shown in FIG. 90.

From FIG. 9B, it is seen that the residual polarization is 22.5 µC/cm$^2$, and the coercive electric field is 36.5 kV/cm. Moreover, the relative permittivity of the PZT film in this case was 1150 and the dielectric loss was 0.05. In particular, it is seen that, when the elapsed time exceeds 10 minutes, there is a tendency for the dielectric loss to increase.

A further increase in the film thickness was attempted without forming the upper electrode. Finally, the functional thin film 86 with the film thickness of 5 µm was obtained. No defects such as cracks occurred in this functional thin film 86.

Example 4

FIG. 10A is a schematic sectional view explaining a state on the electrode layer after the SAM treatment; and FIG. 10B is a schematic sectional view explaining a state on the electrode layer after ultrasonic cleaning.

According to the present invention, the nozzle 14 is provided with the ultrasound generating apparatus 61. Therefore, it is not necessary to soak the substrate in a treatment solution.

As shown in FIG. 10A, an excessive thiol compound 91 which does not adhere to the electrode layer 85 remains on an SAM treated surface of the electrode 85. When ultrasonic cleaning is carried out thereon, as shown in FIG. 10B, the excessive thiol compound 91 which remains on the electrode layer 85 is efficiently removed.

This cleaning uses ultrasonic energy, so that only the thiol compound 91 with a small contact force with platinum is removed. On the other hand, for the thiol compound 91, which is chemically bonded to platinum, the contact force with the electrode layer 85 is strong, so that it still adheres to the electrode layer 65.

The ultrasonic cleaning treatment was carried out for 2 minutes. When the liquid-repellant property was evaluated in a center portion and an outer peripheral portion (here, on a circumference at a distance of 45 mm from a center) of the substrate, the pure water contact angle was 105° and the methoxyethanol contact angle was 73° on the SAM film in the center portion and the outer peripheral portion.

Example 5

Figure 11A:
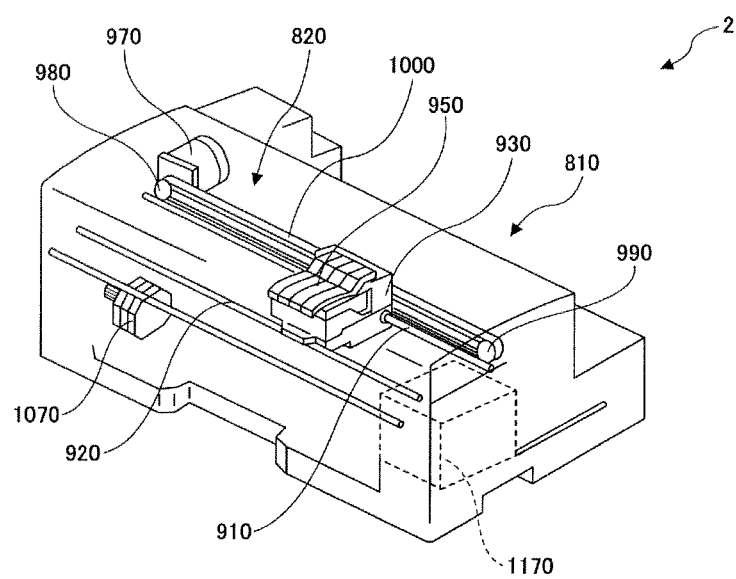
FIG. 11A is a schematic perspective view explaining an inkjet recording apparatus.
Figure 11B:
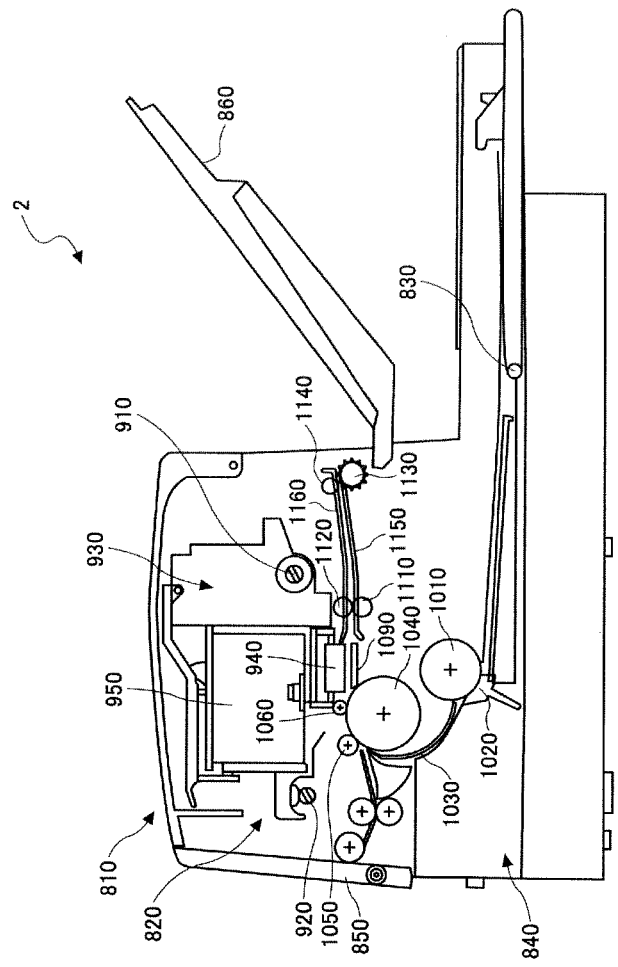
FIG. 11B is a schematic side face view of a machinery portion of the inkjet recording apparatus.

FIG. 11A is a schematic oblique view explaining an inkjet recording apparatus 2 and FIG. 11B is a schematic side face view of a machinery portion of the inkjet recording apparatus 2.

The inkjet recording apparatus 2 has many advantages such as an ability to print at high speed with an extremely low noise level, some degree of freedom of ink, and a possibility of using inexpensive plain paper, so that it is widely deployed as an image recording apparatus or an image forming apparatus such as a printer, a facsimile machine, a copying apparatus, etc.

The inkjet recording apparatus 2 has installed thereon the liquid ejecting head 208. The ink-jet recording apparatus 2 includes, within a recording apparatus body 810, a printing machinery unit 820, etc., including a carriage which is movable in a main scanning direction, a recording head which is mounted on the carriage and which includes the liquid ejecting head 208, an ink cartridge which supplies ink to the recording head, etc.

To a lower portion of the recording apparatus body 810 may be mounted a paper-feeding cassette (or a paper-feeding tray) 840 such that it may be taken out or stuck in freely, on which paper-feeding cassette 840 a large number of sheets 830 can be loaded from the front side. Moreover, a manual tray 850 for manually feeding the sheets 830 may be opened and put down. Taking in the sheets 830 fed from the paper-feeding cassette 840 or the manual tray 850, the print machinery unit 820 records required images, after which it conducts sheet discharging onto a sheet-discharging tray 860 mounted on the back face side.

The print machinery unit 820 holds the carriage 930 with a primary guide rod 910 and a secondary guide rod 920, which are guide members laterally bridging between right and left side plates (not shown) such that the carriage 930 can freely slide in the main scanning direction. The carriage 930 has mounted thereon a recording head 940 with multiple ink droplet ejecting directions facing downward. Multiple ink ejecting ports (nozzles) are aligned in a direction which crosses the main scanning direction. The recording head 940 includes liquid ejecting heads which eject ink droplets of respective colors of yellow (Y), cyan (C), magenta (M), and black (Bk). The carriage 930 has replaceably mounted thereon ink cartridges 950 for supplying ink of each of colors to the recording head 940.

The ink cartridge 950 has, at an upper portion thereof, an atmospheric opening which is communicatively connected to the atmosphere; has, at a lower portion thereof, a supply port which supplies ink to the liquid ejecting head; and has, at an inner portion thereof, a porous body filled with ink. Ink supplied to the liquid ejecting head is kept at a slightly negative pressure by a capillary force of the porous body. Moreover, while the recording heads 940 of each color are used here, it may be arranged to have one recording head which has nozzles ejecting ink droplets of the respective colors.

The carriage 930 has the rear side (the downstream side in a sheet conveying direction) thereof slidably fitted to the primary guide rod 910, and has the front side (the upstream side in the sheet conveying direction) thereof slidably placed on the secondary guide rod 920. The carriage 930 is to be moved and scanned in the main scanning direction. For example, a timing belt 1000 is stretched between a drive pulley 980 and a follower pulley 990 that are rotationally driven by a main scanning motor 970, the timing belt 1000 is fixed to the carriage 930, and the carriage 930 is driven both ways by rotation of the main scanning motor 111 in normal and reverse directions.

In the meantime, in order to convey the sheets 830 set in the paper-feeding cassette 840 to the lower side of the head 940, there are provided a paper-feeding roller 1010 and a friction pad 1020 that separately send the sheets 830 from the paper-feeding cassette 840; a guide member 1030 which guides the sheets 830; a conveying roller 1040 which conveys the fed sheets 830 such that they are reversed; a conveying roller 1050 which is pushed against a peripheral face of the conveying roller 1040; and a tip roller 1060 which specifies an angle of sending out the sheet 830 from the conveying roller 1040. The conveying roller 1040 is rotationally driven via a column of gears by a sub-scanning motor 1070.

Moreover, there is provided an image receiving member 1090, which is a sheet guiding member which guides, on the lower side of the recording head 940, the sheets 830 sent out from the conveying roller 1040 in correspondence with a moving range of the carriage 930 in the main scanning direction. There are provided, on the downstream side of the image receiving member 1090 in the sheet conveying direction, a conveying roller 1110 and a spur 1120 that are rotationally driven for sending out the sheets 830 in a paper-discharging direction; a paper-discharging roller 1130 and a spur 1140 which send out the sheets 830 to the paper-discharging tray 860; and guiding members 1150 and 1160 which form a paper-discharging path.

At a time of recording, the recording head 940 is driven according to an image signal while moving the carriage 930 to eject ink onto one of the sheets 830 at rest to record what amounts to one line, and the following line is recorded after the sheet 830 is conveyed for a predetermined amount. When a recording termination signal or a signal that a trailing edge of the sheet 830 has reached the recording area is received, the recording operation is terminated, so that the sheet 830 is discharged.

Moreover, at a position which is off the recording area on the right end side in a moving direction of the carriage 930 is provided a recovery apparatus 1170 for recovering an ejection failure of the head 940. The recovery apparatus 1170 has a cap unit, an absorption unit, and a cleaning unit. During the time of waiting for printing, the carriage 930 is moved to the recovery apparatus 1170 side and has the head 940 capped with a capping unit, preventing an ejection failure due to drying of ink by maintaining an ejecting outlet in a wet state. Moreover, ink which is not related to recording is ejected at a time such as in the middle of recording, making the viscosity of ink at all of the ejecting outlets constant, and maintaining a stable ejection performance.

When the ejection failure, etc., occurs, the ejecting outlets (nozzles) of the head 940 sealed with the capping unit, foam, etc., are drawn out with ink from the ejecting outlet by an adsorbing unit via a tube, and ink, waste, etc., that are adhered to a face of the ejecting outlet face are removed by a cleaning unit, recovering the ejection failure. Moreover, the adsorbed ink is discharged to a waste ink reservoir (not shown) provided at a lower portion of the body, and is absorbed and maintained in an ink absorbing body within the waste ink reservoir.

In this way, in the inkjet recording apparatus 2, the liquid ejecting head 940 is mounted, so that there is no ink droplet ejection failure due to a failure in driving the vibrating plate, and a stable ink droplet ejecting characteristic is obtained, so that an image quality improves.

While embodiments have been described in the above, the present invention is not to be limited to embodiments shown in the drawings. They may be changed within a range which a skilled person could arrive at, such as other embodiments, additions, changes, deletions, etc. Any mode thereof is to be included in a scope of the present invention as long as it effects advantages of the present invention.

The present application is based on Japanese Priority Application No. 2012-01793B filed on Jan. 31, 2012, the entire contents of which are hereby incorporated by reference.

The invention claimed is:

1. A thin film forming apparatus which automatically forms, on an electrode layer formed on a substrate, functional thin film which is crystallized from a precursor layer, comprising:
   a water-repellant film forming unit which forms, on a region other than a region on which is to be formed the functional thin film on the electrode layer, a water-repellant film which includes a self-assembled monolayer;
   an inkjet coating unit which coats, on the region on which is to be formed the functional thin film on the electrode layer, the precursor layer by an inkjet method; and
   a controller which controls, to within a predetermined time, a time from forming the water-repellant film with the water-repellant film forming unit to coating the precursor layer with the inkjet coating unit.

2. The thin film forming apparatus as claimed in claim 1, wherein the predetermined time is less than or equal to 3 minutes.

3. The thin film forming apparatus as claimed in claim 1, wherein the water-repellant forming unit can execute
   a supplying process which provides a solution including the self-assembled monolayer to the substrate; and
   a cleaning process which removes the self-assembled monolayer which remains on the electrode layer.

4. The thin film forming apparatus as claimed in claim 3, wherein an organic solvent and ultrasound are used.

5. The thin film forming apparatus as claimed in claim 4, wherein an ultrasound generating apparatus which generates the ultrasound is installed at a tip of a nozzle which releases the organic solvent.

6. The thin film forming apparatus as claimed in claim 1, further comprising a pre-cleaning treatment unit which cleans a surface of the electrode layer, wherein a weak acid solution is used in the pre-cleaning treatment unit.

7. An electro-mechanical transducing element, comprising the functional thin film formed with the thin film forming apparatus as claimed in claim 1.

8. A liquid ejecting head, comprising the electro-mechanical transducing element as claimed in claim 7.

9. An inkjet recording apparatus, comprising the liquid ejecting head as claimed in claim 8.

* * * * *